(12) United States Patent
Yoshioka

(10) Patent No.: US 10,833,273 B2
(45) Date of Patent: Nov. 10, 2020

(54) METHOD FOR MANUFACTURING ORGANIC ELEMENT AND METHOD FOR PRODUCING FUNCTION LAYER EACH USING INFRARED RAYS TO HEAT AND CURE COATING FILM

(71) Applicant: SUMITOMO CHEMICAL COMPANY, LIMITED, Tokyo (JP)

(72) Inventor: Hidemi Yoshioka, Niihama (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 39 days.

(21) Appl. No.: 16/309,727

(22) PCT Filed: Jun. 14, 2017

(86) PCT No.: PCT/JP2017/021966
§ 371 (c)(1),
(2) Date: Dec. 13, 2018

(87) PCT Pub. No.: WO2017/217454
PCT Pub. Date: Dec. 21, 2017

(65) Prior Publication Data
US 2019/0140180 A1 May 9, 2019

(30) Foreign Application Priority Data
Jun. 17, 2016 (JP) .................................. 2016-121010

(51) Int. Cl.
*H01L 51/00* (2006.01)
*H01L 51/56* (2006.01)
(Continued)

(52) U.S. Cl.
CPC ...... *H01L 51/0027* (2013.01); *H01L 51/0003* (2013.01); *H01L 51/0028* (2013.01);
(Continued)

(58) Field of Classification Search
CPC ............. H01L 51/0027; H01L 51/0026; H01L 51/0028; F26B 3/30; F26B 3/305; F26B 23/00; F26B 23/06; F26B 23/04
See application file for complete search history.

(56) References Cited

U.S. PATENT DOCUMENTS 5,092,059 A * 3/1992 Wimberger ........... F26B 13/104
34/641
2003/0118965 A1 6/2003 Iwatani et al.
(Continued)

FOREIGN PATENT DOCUMENTS

CN 103328115 A 9/2013
CN 105325056 A 2/2016
(Continued)

OTHER PUBLICATIONS

Communication dated Jan. 22, 2020, from the European Patent Office in European Application No. 17813349.2.
(Continued)

*Primary Examiner* — Michael Jung
(74) *Attorney, Agent, or Firm* — Sughrue Mion, PLLC

(57) ABSTRACT

A method for manufacturing an organic electronic device according to one embodiment includes: a coating film formation step of applying a coating liquid for a functional layer having a predetermined function onto a plastic substrate to form a coating film; and a heating step of heating and curing the coating film by irradiating the coating film with infrared rays in an infrared heating furnace to form the functional layer. In the heating step, the coating film is heated and cured by the infrared rays while a member of the infrared heating furnace is cooled to 100° C. or less, the member being disposed around the plastic substrate so as to be separate from the plastic substrate.

16 Claims, 8 Drawing Sheets

(51) Int. Cl.
  *H05B 33/10* (2006.01)
  *H01L 51/50* (2006.01)
  *H05B 33/02* (2006.01)

(52) U.S. Cl.
  CPC .............. *H01L 51/50* (2013.01); *H01L 51/56* (2013.01); *H05B 33/02* (2013.01); *H05B 33/10* (2013.01)

(56) References Cited

U.S. PATENT DOCUMENTS

| | | | |
|---|---|---|---|
| 2004/0226929 A1* | 11/2004 | Miura | B41M 3/006 219/121.85 |
| 2005/0124258 A1* | 6/2005 | Appelberg | H05B 33/10 445/24 |
| 2006/0057750 A1 | 3/2006 | Aoki et al. | |
| 2013/0219738 A1 | 8/2013 | Fujita et al. | |
| 2014/0058060 A1* | 2/2014 | Uekido | B29C 41/28 528/353 |
| 2014/0103030 A1 | 4/2014 | Ahmed et al. | |
| 2014/0368589 A1* | 12/2014 | Perez Gellida | B41J 11/002 347/102 |
| 2016/0155988 A1* | 6/2016 | Kuroki | H01L 51/0097 257/40 |
| 2019/0154334 A1* | 5/2019 | Jackson | B29C 71/04 |

FOREIGN PATENT DOCUMENTS

| | | |
|---|---|---|
| JP | 2003-194467 A | 7/2003 |
| JP | 2005-81697 A | 3/2005 |
| JP | 2006-85933 A | 3/2006 |
| JP | 2006-100134 A | 4/2006 |
| JP | 2008-226642 A | 9/2008 |
| WO | 2013/180036 A1 | 12/2013 |

OTHER PUBLICATIONS

International Preliminary Report on Patentability dated Dec. 18, 2018 in counterpart international application No. PCT/JP2017/021966.

International Search Report dated Sep. 19, 2017 issued by the International Searching Authority in corresponding application No. PCT/JP2017/021966.

Communication dated Jun. 26, 2018 from the Japanese Patent Office in counterpart application No. 2016-121010.

Communication dated Mar. 16, 2020, from the State Intellectual Property office in application No. 201780037336.7.

* cited by examiner

METHOD FOR MANUFACTURING ORGANIC ELEMENT AND METHOD FOR PRODUCING FUNCTION LAYER EACH USING INFRARED RAYS TO HEAT AND CURE COATING FILM

CROSS REFERENCE TO RELATED APPLICATIONS

This application is a National Stage of International Application No. PCT/JP2017/021966 filed Jun. 14, 2017, claiming priority based on Japanese Patent Application No. 2016-121010, filed Jun. 17, 2016.

TECHNICAL FIELD

The present invention relates to a method for manufacturing an organic electronic device and a method for producing a functional layer.

BACKGROUND ART

An organic electronic device such as an organic electroluminescence device (hereinafter sometimes referred to as an "organic EL device"), an organic photoelectric conversion device, or an organic thin film transistor includes a functional layer provided on a substrate and having a predetermined function.

As an example of the method for forming the functional layer, the technique of Patent Literature 1 is known. In Patent Literature 1, first, a coating liquid having a crosslinkable group and containing a polymer compound which is a material of a functional layer (a conductive thin film in Patent Literature 1) is coated onto a substrate to form a coating film. After that, the coating film is irradiated with infrared rays from an infrared heater, and the coating film is heated and cured by crosslinking the crosslinkable group with the infrared rays to form the functional layer.

CITATION LIST

Patent Literature

Patent Literature 1: WO 2013/180036 A

SUMMARY OF INVENTION

Technical Problem

As disclosed in Patent Literature 1, when the coating film formed on the substrate is heated with the infrared rays, infrared heating of the coating film is usually performed in an infrared heating furnace. In the step of the infrared heating of the coating film, since the infrared rays are emitted radially from the infrared heater, the infrared rays are also irradiated to members around the substrate with the coating film disposed in the infrared heating furnace, for example, the furnace wall of the infrared heating furnace. In this case, the members on which the infrared rays are incident are heated and thus far-infrared radiation occurs.

Recently, a plastic substrate tends to be used as a substrate of an organic electronic device such that the organic electronic device has flexibility. The plastic substrate is more likely to absorb far-infrared rays (for example, infrared rays having a wavelength range of 5.0 μm to 10.0 μm) than near-infrared rays (for example, infrared rays having a wavelength range of 1.2 μm to 5.0 μm) among infrared rays.

Therefore, as described above, for example, when the furnace wall of the infrared heating furnace is heated by the infrared rays and the far-infrared radiation occurs, the plastic substrate is unnecessarily heated by the far-infrared rays. When the plastic substrate is heated as described above, there is a problem that damage (deformation or the like) is caused to the plastic substrate and the manufacturing yield of the organic electronic device is lowered.

Therefore, it is an object of the present invention to provide a method for manufacturing an organic electronic device and a method for producing a functional layer, which can improve manufacturing yield while reducing damage to a plastic substrate.

Solution to Problem

A method for manufacturing an organic electronic device according to one aspect of the present invention is a method for manufacturing an organic electronic device, including: a coating film formation step of applying a coating liquid for a functional layer having a predetermined function onto a plastic substrate to form a coating film; and a heating step of heating and curing the coating film by irradiating the coating film with infrared rays in an infrared heating furnace to form the functional layer, in which in the heating step, the coating film is heated and cured by the infrared rays while a member of the infrared heating furnace is cooled to 100° C. or less, the member being disposed around the plastic substrate so as to be separate from the plastic substrate.

In the heating step of the manufacturing method, the coating film is heated and cured by the infrared rays while a member of the infrared heating furnace is cooled to 100° C. or less, the member being disposed around the plastic substrate so as to be separate from the plastic substrate. Even when the infrared rays are incident on the member cooled to 100° C. or less, the radiation of the infrared rays having a wavelength range of 5.0 μm to 10.0 μm (hereinafter, also referred to as "far-infrared rays") hardly occurs. Therefore, in the heating step, unnecessary heating of the plastic substrate is suppressed. As a result, damage such as deformation hardly occurs on the plastic substrate. Therefore, it is possible to improve the manufacturing yield of the organic electronic device.

The coating liquid may contain a material having a crosslinkable group, and in the heating step, the coating film may be heated and cured by crosslinking the crosslinkable group by the infrared rays.

In the heating step, the coating film may be heated and cured by the infrared rays while a part of a furnace wall, which is a member of the infrared heating furnace, is cooled to 100° C. or less. Therefore, since the far-infrared radiation from a part of the furnace wall is suppressed, damage to the plastic substrate hardly occurs.

The coating film may be heated and cured with the infrared rays while upper and lower regions of the furnace wall in a thickness direction of the plastic substrate are cooled to 100° C. or less. In this case, at least the upper and lower regions of the furnace wall in the thickness direction of the plastic substrate are cooled to 100° C. or less, and the far-infrared radiation from these regions hardly occurs. In general, the area of the front surface (or rear surface) orthogonal to the thickness direction of the plastic substrate is larger than the area of the side surface. Therefore, as described above, the far-infrared radiation from the upper and lower regions of the furnace wall is suppressed, and thus the incidence of the far-infrared rays on the plastic substrate can be effectively suppressed.

In the heating step, the coating film may be irradiated with the infrared rays while the plastic substrate is conveyed in the infrared heating furnace, and the coating film may be heated and cured with the infrared rays while a region of the furnace wall surrounding a conveying path of the plastic substrate in a tunnel shape is cooled to 100° C. or less. In this case, since it is possible to suppress the far-infrared radiation from the region surrounding the conveying path of the plastic substrate among the furnace walls, the incidence of far-infrared rays on the plastic substrate can be further reduced.

The infrared heating furnace may have at least one cooling member between a furnace wall of the infrared heating furnace and the plastic substrate, and the coating film may be heated and cured with the infrared rays while the cooling member is cooled to 100° C. or less together with a part of a furnace wall of the infrared heating furnace.

In this case, since the cooling member is disposed between the furnace wall of the infrared heating furnace and the plastic substrate, the infrared rays from the infrared irradiation section are blocked by the cooling member and can hardly reach the furnace wall. Therefore, the far-infrared radiation from the furnace wall is suppressed. Even if the infrared rays are incident on the cooling member, the far-infrared radiation from the cooling member is also suppressed because the cooling member is cooled to 100° C. or less. Therefore, the incidence of the far-infrared rays on the plastic substrate can be reduced.

The infrared heating furnace may have the cooling member disposed on each of upper and lower sides in the thickness direction of the plastic substrate. In this case, in the heating step, the cooling members disposed respectively on the upper side and the lower side in the thickness direction of the plastic substrate are cooled to 100° C. or less. In general, the area of the front surface (or rear surface) orthogonal to the thickness direction of the plastic substrate is larger than the area of the side surface. Therefore, as described above, when the upper and lower regions of the plastic substrate are cooled to 100° C. or less and the far-infrared radiation from these regions is reduced, the incidence of the far-infrared rays on the plastic substrate can be efficiently suppressed.

In the heating step, the infrared rays may be irradiated onto the coating film while the plastic substrate is conveyed in the infrared heating furnace, and the cooling member may be formed in a tunnel shape so as to surround the conveying path of the plastic substrate. In this case, since the cooling member is formed in the tunnel shape and surrounds the plastic substrate, the incidence of the infrared rays on the furnace wall is further reduced, and the far-infrared radiation from the furnace wall can be suppressed. Furthermore, since the cooling member formed in the tunnel shape is also cooled to 100° C. or less, the far-infrared radiation from the cooling member can also be suppressed. Therefore, the far-infrared rays from the region surrounding the conveying path of the plastic substrate are more difficult to enter the plastic substrate.

Among the infrared rays incident on the plastic substrate, an amount of infrared rays having a wavelength range of 5.0 μm to 10.0 μm may be ⅓ or less of an amount of infrared rays having a wavelength range of 1.2 μm to 5.0 μm.

In the member cooled to 100° C. or less, an average absorption rate of infrared rays (far-infrared rays) having a wavelength range of 5.0 μm to 10.0 μm may be 80% or more. Therefore, the member absorbs more infrared rays in the wavelength range contributing to the temperature rise of the plastic substrate. Since the member is cooled to 100° C. or less, the far-infrared radiation from the member does not occur even if the far-infrared rays are absorbed by the member.

In the heating step, inert gas may be blown onto at least one of the plastic substrate and the coating film. In this case, since the plastic substrate is cooled with the inert gas, the temperature rise of the plastic substrate can be suppressed.

The plastic substrate may have a band shape and be flexible, and a length of the plastic substrate in a longitudinal direction may be 10 times or more of a length in a short side direction. In this case, for example, the roll-to-roll method can be applied to the method for manufacturing the organic electronic device, and the productivity of the organic electronic device can be improved.

A method for producing a functional layer according to another aspect of the present invention, includes: a coating film formation step of applying a coating liquid for a functional layer having a predetermined function onto a plastic substrate to form a coating film; and a heating step of heating and curing the coating film by irradiating the coating film with infrared rays in an infrared heating furnace to form the functional layer, in which in the heating step, the coating film is heated and cured by the infrared rays while a member of the infrared heating furnace is cooled to 100° C. or less, the member being disposed around the plastic substrate so as to be separate from the plastic substrate.

In the heating step of the producing method, the coating film is heated and cured by the infrared rays while a member of the infrared heating furnace is cooled to 100° C. or less, the member being disposed around the plastic substrate so as to be separate from the plastic substrate. Here, even if the infrared rays are incident on the member cooled to 100° C. or less, the radiation of the far-infrared rays hardly occurs. Therefore, in the heating step, unnecessary heating of the plastic substrate is suppressed. As a result, damage such as deformation hardly occurs on the plastic substrate. Therefore, it is possible to improve the manufacturing yield of the organic electronic device by using the method for producing the functional layer in the manufacture of the organic electronic device.

Advantageous Effects of Invention

According to the present invention, it is possible to provide a method for manufacturing an organic electronic device and a method for forming a functional layer, which can improve manufacturing yield while reducing damage to a plastic substrate.

DESCRIPTION OF EMBODIMENTS

Figure 1:
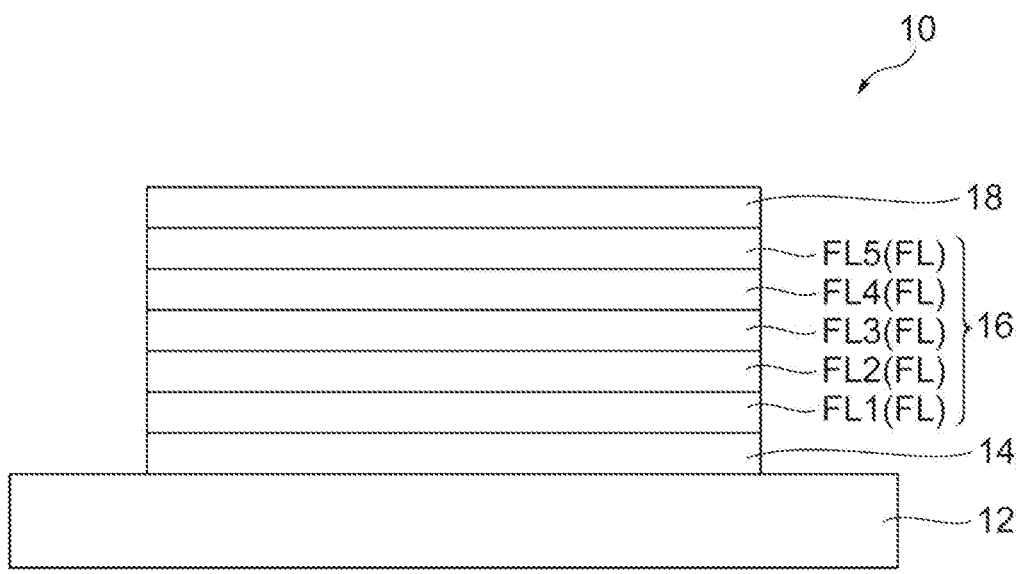
FIG. 1 is a schematic diagram illustrating a schematic configuration of an organic EL device which is an example of an organic electronic device manufactured by a method for manufacturing an organic electronic device according to the present invention.

Hereinafter, embodiments of the present invention will be described with reference to the drawings. The same reference numerals are assigned to the same devices. A redundant description thereof will be omitted. The dimensional ratios in the drawings do not always coincide with those described. In the description, words indicating directions such as "above" and "below" are convenience words based on the states illustrated in the drawing.

In the present embodiment, a mode in which an organic electronic device is an organic EL device will be described. An organic EL device 10, which is schematically illustrated in FIG. 1 and manufactured by a method for manufacturing an organic EL device (organic electronic device) according to one embodiment, is used in, for example, a curved or planar lighting device, for example, a planar light source used as a light source of a scanner, and a display device.

The organic EL device 10 includes a plastic substrate 12, a anode 14, an organic EL section 16, and a cathode 18. The organic EL device 10 can take a form of emitting light from the anode 14 side or a form of emitting light from the cathode 18 side. Hereinafter, the form of emitting light from the anode 14 side will be described unless otherwise specified.

[Plastic Substrate]

The plastic substrate 12 has translucency with respect to visible light (light having a wavelength of 400 nm to 800 nm). The plastic substrate 12 has, for example, a film shape and is flexible. The thickness of the plastic substrate 12 is, for example, 30 µm to 700 µm.

Examples of a material (plastic material) of the plastic substrate 12 include: polyethersulfone (PES); a polyester resin such as polyethylene terephthalate (PET) and polyethylene naphthalate (PEN); a polyolefin resin such as polyethylene (PE), polypropylene (PP), and cyclic polyolefin; a polyamide resin; a polycarbonate resin; a polystyrene resin; a polyvinyl alcohol resin; a saponified product of ethylene-vinyl acetate copolymer; a polyacrylonitrile resin; an acetal resin; a polyimide resin; and an epoxy resin.

A driving circuit (for example, a circuit including a thin film transistor or the like) for driving the organic EL device 10 may be formed on the plastic substrate 12. Such a driving circuit is usually made of a transparent material.

A barrier film may be formed on the plastic substrate 12. The barrier film has a moisture barrier function. The barrier film may have a gas (for example, oxygen) barrier function. The barrier film can be, for example, a film made of silicon, oxygen, and carbon, or a film made of silicon, oxygen, carbon, and nitrogen. Specifically, examples of a material of the barrier film include silicon oxide, silicon nitride, and silicon oxynitride. The thickness of the barrier film is, for example, 100 nm to 10 µm.

[Anode]

The anode 14 is provided on the plastic substrate 12. In a mode in which the barrier film is formed on the plastic substrate 12, the anode 14 is provided on the barrier film. As the anode 14, an electrode exhibiting light transmission characteristics is used. A thin film such as a metal oxide, a metal sulfide, and a metal having high electrical conductivity can be used as the electrode exhibiting light transmission characteristics, and a thin film having high light transmittance is suitably used. The anode 14 may have a network structure made of a conductor (for example, a metal).

Examples of a material of the anode 14 include indium oxide, zinc oxide, tin oxide, indium tin oxide (indium tin oxide: abbreviated as ITO), indium zinc oxide (indium zinc oxide: abbreviated as IZO), gold, platinum, silver, and copper. Among them, ITO, IZO, or tin oxide is preferable. As the material of the anode 14, organic materials such as polyaniline and derivatives thereof or polythiophene and derivatives thereof may be used. In this case, the anode 14 can be formed as a transparent conductive film.

The thickness of the anode 14 can be determined in consideration of light transmission characteristics, electric conductivity, and the like. The thickness of the anode 14 is usually 10 nm to 10 µm, preferably 20 nm to 1 µm, and more preferably 50 nm to 500 nm.

[Organic EL Section]

The organic EL section 16 is provided on the anode 14. The organic EL section 16 is a function section which contributes to light emission of the organic EL device 10, such as movement of charges or recombination of charges, according to voltages applied to the anode 14 and the cathode 18.

The organic EL section 16 includes a hole injection layer FL1, a hole transport layer FL2, a light emitting layer FL3, an electron transport layer FL4, and an electron injection layer FL5, which are laminated in this order from the anode 14 side to form a laminate. The hole injection layer FL1, the hole transport layer FL2, the light emitting layer FL3, the electron transport layer FL4, and the electron injection layer FL5 are each a functional layer having a predetermined function. The organic EL section 16 is not limited to the one that is exemplified as long as the organic EL section 16 includes the light emitting layer FL3.

The hole injection layer FL1 is provided on the anode 14 and is a layer having a function of improving hole injection efficiency from the anode 14 to the light emitting layer FL3. The optimum value of the thickness of the hole injection layer FL1 is different depending on the material to be used, and is appropriately set such that the driving voltage and the luminescent efficiency become appropriate values. The thickness of the hole injection layer FL1 is, for example, 1 nm to 1 µm, preferably 2 nm to 500 nm, more preferably 5 nm to 200 nm.

As a material of the hole injection layer FL1, a known hole injection material can be used. Examples of the hole injection material include oxides such as vanadium oxide, molybdenum oxide, ruthenium oxide, and aluminum oxide, polythiophene derivatives such as polyethylene dioxythiophene (PEDOT), a phenylamine compound, a starburst type amine compound, a phthalocyanine compound, an amorphous carbon, and polyaniline.

The hole transport layer FL2 is provided on the hole injection layer FL1 and is a layer having a function of improving the hole injection from the anode 14, the hole injection layer FL1, or the portion closer to the anode 14 in the hole transport layer FL2 to the light emitting layer FL3. The optimum value of the thickness of the hole transport layer FL2 is different depending on the material to be used, and is appropriately set such that the driving voltage and the luminescent efficiency become appropriate values. The thickness of the hole transport layer FL2 is, for example, 1 nm to 1 µm, preferably 2 nm to 500 nm, more preferably 5 nm to 200 nm.

As a material of the hole transport layer FL2, a known hole transport material can be used. Examples of the material of the hole transport layer FL2 include polyvinylcarbazole or a derivative thereof, polysilane or a derivative thereof, polysiloxane having an aromatic amine in a side chain or main chain or a derivative thereof, pyrazoline or a derivative thereof, arylamine or a derivative thereof, stilbene or a derivative thereof, triphenyldiamine or a derivative thereof, polyaniline or a derivative thereof, polythiophene or a derivative thereof, polyarylamine or a derivative thereof, polypyrrole or a derivative thereof, poly(p-phenylene vinylene) or a derivative thereof, and poly(2,5-thienylenevinylene) or a derivative thereof. Examples of the material of the hole transport layer FL2 include a hole transport material disclosed in Japanese Unexamined Patent Publication No. 2012-144722.

The light emitting layer FL3 is provided on the hole transport layer FL2, and the light emitting layer FL3 is a layer having a function of emitting light having a predetermined wavelength. The optimum value of the thickness of the light emitting layer FL3 is different depending on the material to be used, and is appropriately set such that the driving voltage and the luminescent efficiency become appropriate values.

The light emitting layer FL3 is usually made of an organic material which mainly emits fluorescence and/or phosphorescence, or the organic material and a dopant for assisting the organic material. The dopant is added, for example, for improving luminescent efficiency, changing the emission wavelength, or the like. The organic material contained in the light emitting layer FL3 may be a low-molecular-weight compound or a high-molecular-weight compound. Examples of the light emission material constituting the light emitting layer FL3 include a dye-based material, a metal complex-based material, a polymer-based material, and a dopant material, which are described below.

Examples of the dye-based light emission material include cyclopendamine or a derivative thereof, tetraphenylbutadiene or a derivative thereof, triphenylamine or a derivative thereof, oxadiazole or a derivative thereof, pyrazoloquinoline or a derivative thereof, distyrylbenzene or a derivative thereof, distyrylarylene or a derivative thereof, pyrrole or a derivative thereof, a thiophene ring compound, a pyridine ring compound, perinone or a derivative thereof, perylene or a derivative thereof, oligothiophene or a derivative thereof, an oxadiazole dimer or a derivative thereof, a pyrazoline dimer or a derivative thereof, quinacridone or a derivative thereof, and coumarin or a derivative thereof.

Examples of the metal complex-based light emission material include metal complexes which has rare earth metals such as Tb, Eu, and Dy, or Al, Zn, Be, Pt, or Ir as a central metal, and has oxadiazole, thiadiazole, phenyl pyridine, phenylbenzimidazole, or quinoline structure as a ligand. Examples of the metal complex include a metal complex having light emission from a triplet excited state, such as an iridium complex and a platinum complex, an aluminum quinolinol complex, a benzoquinolinol beryllium complex, a benzoxazolyl zinc complex, a benzothiazole zinc complex, an azomethyl zinc complex, a porphyrin zinc complex, and a phenanthroline europium complex.

Examples of the polymer-based light emission material include polyparaphenylenevinylene or a derivative thereof, polythiophene or a derivative thereof, polyparaphenylene or a derivative thereof, polysilane or a derivative thereof, polyacetylene or a derivative thereof, polyfluorene or a derivative thereof, polyvinylcarbazole or a derivative thereof, and a material obtained by polymerizing at least one of the dye material and the metal complex material described above.

Examples of the dopant material include perylene or a derivative thereof, coumarin or a derivative thereof, rubrene or a derivative thereof, quinacridone or a derivative thereof, squalium or a derivative thereof, porphyrin or a derivative thereof, styryl dye, tetracene or a derivative thereof, pyrazolone or a derivative thereof, decacyclene or a derivative thereof, and phenoxazone or a derivative thereof.

The electron transport layer FL4 is provided on the light emitting layer FL3 and is a layer having a function of improving the electron injection from the cathode 18, the electron injection layer FL5, or the portion closer to the cathode 18 in the electron transport layer FL4 to the light emitting layer FL3. The optimum value of the thickness of the electron transport layer FL4 is different depending on the material to be used, and is appropriately set such that the driving voltage and the light emission efficiency become appropriate values. The thickness of the electron transport layer FL4 is, for example, 1 nm to 1 µm, preferably 2 nm to 500 nm, more preferably 5 nm to 200 nm.

As a material of the electron transport layer FL4, a known electron transport material can be used. Examples of the electron transport material constituting the electron transport layer FL4 include a metal complex of oxadiazole derivative, anthraquinodimethane or a derivative thereof, benzoquinone or a derivative thereof, naphthoquinone or a derivative thereof, anthraquinone or a derivative thereof, tetracyanoanthraquinodimethane or a derivative thereof, fluorenone derivative, diphenyldicyanoethylene or a derivative thereof, diphenoquinone derivatives, or 8-hydroxyquinoline or a derivative thereof, polyquinoline or a derivative thereof, polyquinoxaline or a derivative thereof, and polyfluorene or a derivative thereof.

The electron injection layer FL5 is provided on the electron transport layer FL4 and has a function of improving the electron injection efficiency from the cathode 18 to the light emitting layer FL3. The optimum value of the thickness of the electron injection layer FL5 is different depending on the material to be used, and is appropriately set such that the driving voltage and the light emission efficiency become appropriate values. The thickness of the electron injection layer FL5 is, for example, 1 nm to 1 µm.

As a material of the electron injection layer FL5, a known electron injection material can be used. Examples of the material of the electron injection layer FL5 include an alkali metal, an alkaline earth metal, an alloy containing one or more kinds of an alkali metal and an alkaline earth metal, oxide, halide, carbonate of an alkali metal or an alkaline earth metal, or mixtures thereof.

Examples of the alkali metal and the oxide, the halide, and the carbonate of the alkali metal include lithium, sodium, potassium, rubidium, cesium, lithium oxide, lithium fluoride, sodium oxide, sodium fluoride, potassium oxide, potassium fluoride, rubidium oxide, rubidium fluoride, cesium oxide, cesium fluoride, and lithium carbonate.

Examples of the alkaline earth metal and the oxide, the halide, and the carbonate of the alkaline earth metal include magnesium, calcium, barium, strontium, magnesium oxide, magnesium fluoride, calcium oxide, calcium fluoride, barium oxide, barium fluoride, strontium oxide, strontium fluoride, and magnesium carbonate.

In addition, a layer in which a conventionally known electron transport organic material and an alkali metal organometallic complex are mixed can be used as the electron injection layer FL5. In addition, an ionic polymer compound containing an alkali metal salt described in International Publication No. 12/133229 in a side chain can also be used as the electron injection layer FL5.

[Cathode]

The cathode 18 is provided on the organic EL section 16. The optimum value of the thickness of the cathode 18 is different depending on the material to be used, and is set in consideration of electrical conductivity, durability, and the like. The thickness of the cathode 18 is usually 10 nm to 10 μm, preferably 20 nm to 1 μm, and more preferably 50 nm to 500 nm.

Examples of the material of the cathode 18 include an alkali metal, an alkaline earth metal, a transition metal, and a group 13 metal of the periodic table. As the cathode 18, a transparent conductive electrode made of a conductive metal oxide, a conductive organic material, and the like may be used.

Figure 2:
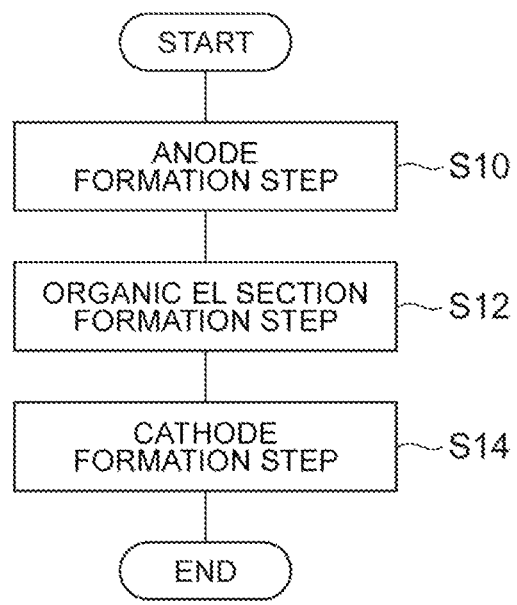
FIG. 2 is a flowchart of a method for manufacturing the organic EL device illustrated in FIG. 1.

Next, as an example of the method for manufacturing the organic EL device 10, a case in which the organic EL device 10 is manufactured by using the flexible band-shaped (or elongated) plastic substrate 12 will be described. The band-shaped plastic substrate 12 is, for example, a plastic substrate, of which the length in the longitudinal direction is 10 times or more the length in the width direction (short side direction). As illustrated in FIG. 2, the method for manufacturing the organic EL device 10 includes a anode formation step S10, an organic EL section formation step S12, and a cathode formation step S14.

[Anode Formation Step]

In the anode formation step S10, a anode 14 is formed on a plastic substrate 12. In the case of using the band-shaped plastic substrate 12, a plurality of organic EL device formation regions is set in a longitudinal direction of the plastic substrate 12, and the anode 14 is formed in each of the organic EL device formation regions. The anode 14 can be formed by a method known in the manufacture of the organic EL device. Examples of the method for forming the anode 14 include a vacuum deposition method, a sputtering method, an ion plating method, a plating method, and a coating method.

Examples of the coating method include an inkjet printing method, but any other known coating method may be used as long as it is a coating method capable of forming the anode 14. Examples of the known coating method other than the inkjet printing method include a microgravure coating method, a gravure coating method, a bar coating method, a roll coating method, a wire bar coating method, a spray coating method, a screen printing method, a flexographic printing method, an offset printing method, and a nozzle printing method.

A solvent of a coating liquid containing the material of the anode 14 may be any solvent as long as the solvent can dissolve the material of the anode 14. Examples of the solvent include a chloride solvent such as chloroform, methylene chloride and dichloroethane, an ether solvent such as tetrahydrofuran, an aromatic hydrocarbon solvent such as toluene and xylene, a ketone solvent such as acetone and methyl ethyl ketone, and an ester solvent such as ethyl acetate, butyl acetate and ethyl cellosolve acetate.

[Organic EL Section Formation Step]

In the organic EL section formation step S12, an organic EL section 16 is formed on the anode 14. The organic EL section 16 is formed on the anode 14 by sequentially laminating a hole injection layer FL1, a hole transport layer FL2, a light emitting layer FL3, an electron transport layer FL4, and an electron injection layer FL5.

Figure 3:
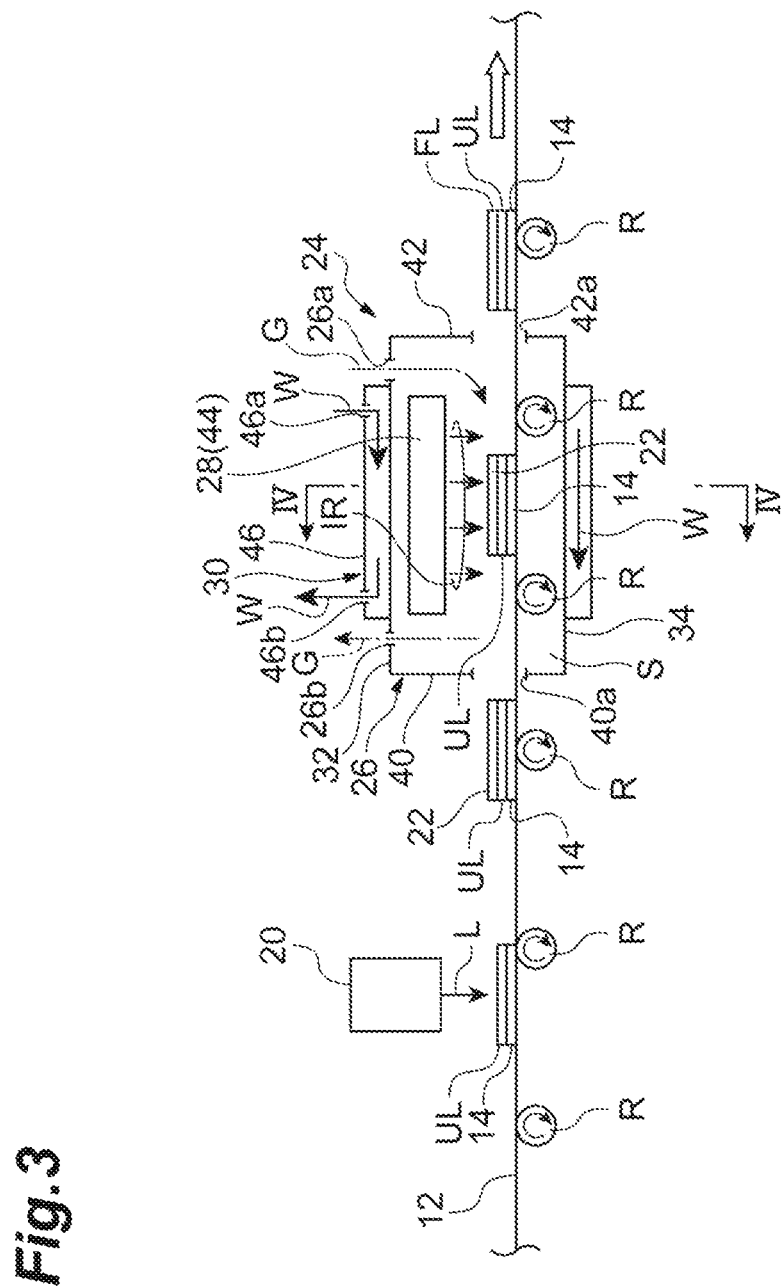
FIG. 3 is a diagram for describing a method for producing a functional layer.
Figure 4:
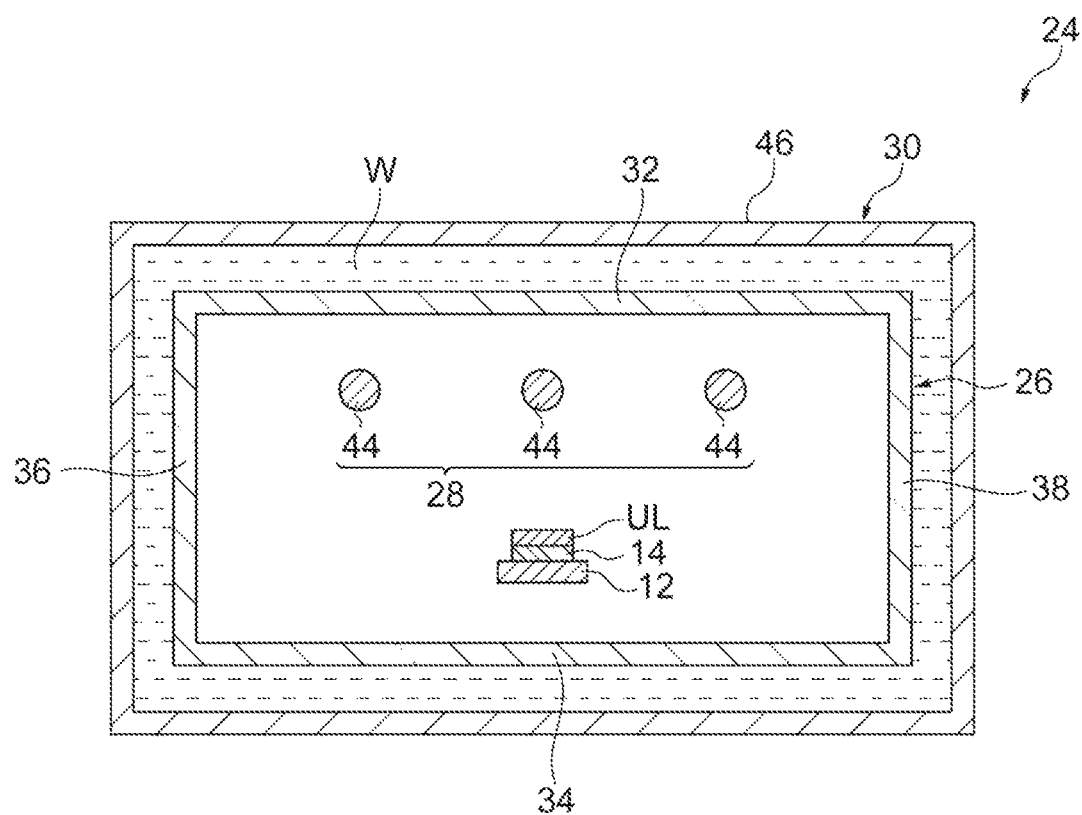
FIG. 4 is a schematic diagram of a cross-sectional configuration taken along line IV-IV of an infrared heating furnace illustrated in FIG. 3.

The hole injection layer FL1, the hole transport layer FL2, the light emitting layer FL3, the electron transport layer FL4, and the electron injection layer FL5 are referred to as a functional layer FL, and the method for forming the functional layer FL (the method for producing the functional layer) will be described with reference to FIGS. 3 and 4. FIG. 3 is a conceptual diagram of the method for forming the functional layer FL. FIG. 4 is a schematic diagram of a cross-sectional configuration taken along line IV-IV of an infrared heating furnace illustrated in FIG. 3.

In FIG. 3, the layer already formed before the formation of the functional layer FL to be formed is illustrated as an underlayer UL. The underlayer UL is, for example, the anode 14 with respect to the hole injection layer FL1, is the anode 14 and the hole injection layer FL1 with respect to the hole transport layer FL2, and is the anode 14, the hole injection layer FL1 and the hole transport layer FL2 with the light emitting layer FL3. The underlayer UL with respect to the electron transport layer FL4 and the electron injection layer FL5 is also defined in a similar manner.

The method for forming the functional layer FL includes a coating film formation step and a heating step. In the present embodiment, the coating step and the heating step are sequentially performed while the band-shaped plastic substrate 12 is conveyed by a conveying roller R in the longitudinal direction thereof (direction of the outline arrow in FIG. 3).

<Coating Film Formation Step>

In the coating film formation step, as illustrated in FIG. 3, a coating liquid L containing a material for the functional layer FL is applied from a coating apparatus 20 onto the plastic substrate 12 (specifically, on the underlayer UL) to form a coating film 22. The coating apparatus 20 may be one that corresponds to the coating method (the method for applying the prepared coating liquid).

As in the present embodiment, examples of the coating method performed at a time when the band-shaped plastic substrate 12 is conveyed include a slit coating method (die coating method), a microgravure coating method, a gravure coating method, a bar coating method, a roll coating method, a wire bar coating method, a spray coating method, a screen printing method, a flexographic printing method, an offset printing method, an ink jet printing method, and a nozzle printing method. When the coating method is the inkjet printing method, the coating apparatus 20 may be an inkjet apparatus including an inkjet nozzle.

A solvent of a coating liquid L containing the material of the functional layer FL may be any solvent as long as the solvent can dissolve the material of the functional layer FL. The solvent may be the same as the solvent mentioned above in the description of the anode formation step S10.

The coating liquid L may contain a crosslinkable group. When the functional layer FL contains an organic compound, the crosslinkable group may be contained in the organic compound, or a crosslinking agent may be used as the material having the crosslinkable group.

Examples of the crosslinkable group include a vinyl group, an ethynyl group, a butenyl group, an acryloyl group, an acryloyloxyalkyl group, an acryloylamide group, a methacryloyl group, a methacryloyloxyalkyl group, a methacryloylamide group, a vinyl ether group, a vinylamino group, a silanol group, and a group having a small-membered ring (for example, cyclopropane, cyclobutane, epoxide, oxetane, diketene, and episulfide) (for example, a cyclopropyl group, a cyclobutyl group, an epoxy group, an oxetane group, a diketene group, an episulfide group, a 3-membered or 4-membered lactone group, and a 3-membered or 4-membered lactam group).

Examples of the crosslinking agent include a compound having a polymerizable group selected from the group consisting of a vinyl group, an ethynyl group, a butenyl group, an acryloyl group, an acryloyloxyalkyl group, an acryloylamide group, a methacryloyl group, a methacryloyloxyalkyl group, a methacryloylamide group, a vinyl ether group, a vinylamino group, a silanol group, a cyclopropyl group, a cyclobutyl group, an epoxy group, an oxetane group, a diketene group, an episulfide group, a 3-membered or 4-membered lactone group, and a 3-membered or 4-membered lactam group. As the crosslinking agent, for example, a multifunctional acrylate is preferable, and examples of the multifunctional acrylate include dipentaerythritol hexaacrylate (DPHA) and tris pentaerythritol octaacrylate (TPEA).

In the coating film formation step, the coating film 22 formed on the plastic substrate 12 is carried into the infrared heating furnace 24 provided on the conveying path as the plastic substrate 12 is conveyed.

[Heating Step]

In the heating step, the coating film 22 is heated and cured in the infrared heating furnace 24 to form the functional layer FL. The infrared heating furnace 24 used in the heating step will be described. As illustrated in FIGS. 3 and 4, the infrared heating furnace 24 includes a housing 26, an infrared irradiation section 28, and a cooling mechanism 30.

The housing 26 accommodates the infrared irradiation section 28, and forms a heating space S for heating the coating film 22. In the present embodiment, the housing 26 extends in the conveying direction of the plastic substrate 12. The housing 26 has a box shape, and a top wall 32, a bottom wall 34, side walls 36 and 38 (see FIG. 4), and side walls 40 and 42 constituting the housing 26 function as the furnace wall of the infrared heating furnace 24. Examples of the material of the top wall 32, the bottom wall 34, and the side walls 36, 38, 40, and 42 include stainless steel (hereinafter, also referred to as "SUS" in some cases). The top wall 32, the bottom wall 34, and the side walls 36 and 38 extend in the conveying direction of the plastic substrate 12. The side wall 40 and the side wall 42 are substantially orthogonal to the conveying direction of the plastic substrate 12. In each of the side wall 40 and the side wall 42, a carry-in port 40a and a carry-out port 42a through which the plastic substrate 12 passes are formed.

A gas supply port 26a for supplying inert gas G to the heating space S may be formed in the housing 26. For example, the gas supply port 26a can be formed in the vicinity of one end of the housing 26 in the conveying direction of the plastic substrate 12. In the example of FIG. 3, the gas supply port 26a is formed in the top wall 32, but the location at which the gas supply port 26a is formed is not limited to the location illustrated in FIG. 3. An example of the inert gas is argon gas. The functional layer FL can be formed in an inert gas atmosphere by supplying the inert gas G to the housing 26 from the gas supply port 26a, and deterioration of the functional layer FL due to moisture can be suppressed. In a case in which the gas supply port 26a is formed in the housing 26 in such a manner, a gas discharge port 26b for discharging the inert gas G supplied to the heating space S from the gas supply port 26a may be formed in the housing 26.

When the gas supply port 26a is formed in the vicinity of one end of the housing 26 in the conveying direction of the plastic substrate 12, the gas discharge port 26b may be formed in the vicinity of the other end of the housing 26 in the conveying direction of the plastic substrate 12. Therefore, the inert gas G can flow in the longitudinal direction of the plastic substrate 12, and the plastic substrate 12 can be cooled with the inert gas G when the coating film 22 is heated. In the example of FIG. 3, the gas discharge port 26b is formed in the top wall 32, but the location at which the gas discharge port 26b is formed is not limited to the location illustrated in FIG. 3. In the following description, unless otherwise specified, a mode in which the inert gas G is supplied to the infrared heating furnace 24 to form the functional layer FL under the inert gas G atmosphere will be described.

In one embodiment, a cooling air introduction port for supplying cooling air to the heating space S may be formed in the housing 26.

The infrared irradiation section 28 has a plurality of infrared lamps 44. In the embodiment illustrated in FIG. 4, the infrared irradiation section 28 has three infrared lamps 44. Each of the infrared lamps 44 extends in the conveying direction of the plastic substrate 12, and the plurality of infrared lamps 44 is arranged in parallel. The infrared lamps 44 may be disposed so as to be able to irradiate the coating film 22 with infrared rays IR. In the present embodiment, as illustrated in FIGS. 3 and 4, the infrared lamps 44 are disposed at positions facing the coating film 22. Generally, the infrared lamp 44 emits infrared rays IR having a wavelength range of 1.2 μm to 10.0 μm. In FIG. 4, the infrared irradiation section 28 has a plurality of infrared lamps 44 as an example, but the infrared irradiation section 28 only needs to have at least one infrared lamp 44.

A cooling mechanism 30 has a cooling jacket 46 provided in the housing 26 so as to surround the conveying path of the plastic substrate 12 and cools the housing 26. Specifically, the cooling jacket 46 is provided so as to cover the top wall 32, the bottom wall 34, and the side walls 36 and 38. The cooling jacket 46 extends in the conveying direction of the plastic substrate 12.

A space through which cooling water W flows is formed in the cooling jacket 46. The cooling jacket 46 is a cooling water flow path which allows the cooling water W supplied from an inlet 46a formed on one end side of the cooling jacket 46 to flow toward an outlet 46b formed on the other end side. It is enough that the cooling jacket 46 is configured such that the cooling water W flows inside the cooling jacket 46 and part of the housing 26 (the top wall 32, the bottom wall 34, and the side walls 36 and 38 in the present embodiment) can be cooled with the cooling water W. The cooling mechanism 30 may be a cooling water pipe provided on the top wall 32, the bottom wall 34, and the side walls 36 and 38, or the inner surface or the outer surface thereof.

In the housing 26, the inner surfaces of the top wall 32, the bottom wall 34, and the side walls 36 and 38 cooled by the cooling mechanism 30 are coated with an absorbent which absorbs infrared rays having a wavelength range of 5.0 μm to 10.0 μm, and an average absorption rate of infrared rays having a wavelength range of 5.0 μm to 10.0 μm in each of the top wall 32, the bottom wall 34, and the side walls 36 and 38 may be 80% or more. The average absorption rate is obtained by dividing the energy absorption amount in the wavelength region by the irradiation energy in the wavelength region. However, the product of the infrared absorption rate and the infrared intensity at a specific wavelength is the energy absorption amount at the specific wavelength, and a value obtained by integrating the energy absorption amount at the specific wavelength in the wavelength region is defined as the energy absorption amount in the wavelength region. When the top wall 32, the bottom wall 34, and the side walls 36 and 38 are made of a material having an average absorption rate of infrared rays of 80% or more, coating is unnecessary.

The heating step of heating the coating film 22 by using the infrared heating furnace 24 will be described in more detail.

When the coating film 22 formed on the plastic substrate 12 is carried in the infrared heating furnace 24 through the carry-in port 40a, the infrared irradiation section 28 irradiates the coating film 22 with infrared rays IR. Therefore, the coating film 22 is heated and cured to form the functional layer FL. In a case in which the coating liquid L has a crosslinkable group, a crosslinking reaction (including a polymerization reaction) is generated by heating the coating film 22 with infrared rays IR. Therefore, the crosslinkable group is crosslinked and the coating film 22 is cured to form the functional layer FL.

The functional layer FL formed on the plastic substrate 12 in such a manner is carried out from the carry-out port 42a. The conveying speed of the plastic substrate 12 may be adjusted such that the coating film 22 is heated and cured to form the functional layer FL by the infrared rays IR from the infrared irradiation section 28 while passing through the infrared heating furnace 24.

When the coating film 22 is cured to form the functional layer FL as described above, the cooling water W is caused to flow into the cooling jacket 46 of the cooling mechanism 30, and the inner surface of the housing 26, more specifically, the inner surfaces of the top wall 32, the bottom wall 34, and the side walls 36 and 38 are cooled to 100° C. or less. The temperature, the flow rate, and the like of the cooling water W may be set such that the inner surfaces of the top wall 32, the bottom wall 34, and the side walls 36 and 38 become 100° C. or less.

When the coating film 22 is heated and cured in the heating step, the inert gas G is supplied to the housing 26 from the gas supply port 26a, and the interior of the housing 26 is kept under the inert gas atmosphere. In addition, the inert gas G may be blown onto at least one of the plastic substrate 12 and the coating film 22 while the inert gas G is discharged from the gas discharge port 26b and the inert gas G is flowed in the housing 26.

When each layer is formed, the hole injection layer FL1, the hole transport layer FL2, the light emitting layer FL3, the electron transport layer FL4, and the electron injection layer FL5 are formed on the anode 14 by sequentially performing the method for forming the functional layer FL. As illustrated in FIG. 3, these can be continuously performed while the plastic substrate 12 in the longitudinal direction thereof is conveyed.

<Cathode Formation Step>

In the cathode formation step S14, a cathode 18 is formed on the organic EL section 16. Since the method for forming the cathode 18 can be the same as the method for forming the anode 14, a description thereof will be omitted.

In the present embodiment, since the anode 14, the organic EL section 16, and the cathode 18 are provided in each of the plurality of organic EL device formation regions set on the band-shaped plastic substrate 12, a cutting step is performed after cathode formation step S14 to cut out the organic EL device 10. A sealing step of sealing the organic EL device 10 with a sealing member may be performed before or after the cutting step.

The anode formation step S10, the organic EL section formation step S12, and the cathode formation step S14 may be performed in a roll-to-roll method in which these steps are sequentially performed while the plastic substrate 12 is fed out from the first roll (unwinding roll) on which the band-shaped plastic substrate 12 is wound, and is wound on the second roll (winding roll). The method for forming the functional layer FL as illustrated in FIG. 3 corresponds to a partial enlarged view when the organic EL section 16 is formed by the roll-to-roll method. Any of the anode formation step S10, the organic EL section formation step S12, and the cathode formation step S14 may be performed by the roll-to-roll method.

The operation and effect of the manufacturing method will be described. Even in the following description, the hole injection layer FL1, the hole transport layer FL2, the light emitting layer FL3, and the like are referred to as the functional layer FL.

In the manufacturing method, the functional layer FL such as the hole injection layer FL1, the hole transport layer FL2, and the light emitting layer FL3 constituting the organic EL section 16 is formed by the coating method. That is, after the coating film 22 is formed on the plastic substrate 12, the coating film 22 is heated and cured with infrared rays IR to form the functional layer FL.

Since the coating method is employed for the formation of the functional layer FL, the coating film formation step and the heating step can be continuously performed while the plastic substrate 12 is conveyed as illustrated in FIG. 3. Furthermore, the functional layer FL included in the organic EL section 16 usually has an absorption peak in a wavelength range of 1.2 μm to 5.0 μm in the infrared rays IR, and tends to absorb more infrared rays having a wavelength range of 1.2 μm to 5.0 μm than infrared rays having a wavelength range of 5.0 μm to 10.0 μm included in infrared rays IR. Therefore, since the coating film 22 can be efficiently heated by irradiating the coating film 22 with infrared rays having a wavelength range of 1.2 μm to 10.0 μm, the time of the heating step can be shortened. As a result, the productivity of the organic EL device 10 is improved.

Since the infrared rays having a wavelength range of 1.2 μm to 5.0 μm correspond to near-infrared rays and the infrared rays having a wavelength range of 5.0 μm to 10.0 μm correspond to far-infrared rays, the infrared rays having a wavelength range of 1.2 μm to 5.0 μm and the infrared rays having a wavelength range of 5.0 μm to 10.0 μm are sometimes simply referred to as near-infrared rays and far-infrared rays, respectively.

In the present embodiment, in the heating step of heating the coating film 22 by using the infrared rays IR, it is important that a part of the housing 26 which is the member of the infrared heating furnace 24, that is, the top wall 32, the bottom wall 34, and the side wall 36 and 38 is cooled to 100° C. or less. This point will be described in comparison with a case in which a part of the housing 26 is not cooled.

First, a case in which a part of the housing 26 is not cooled will be described. Since the infrared rays IR are radially emitted from the infrared lamp 44 of the infrared irradiation section 28, the infrared rays IR emitted from the infrared lamp 44 are also incident on the housing 26 as well as the coating film 22. When the infrared rays IR are incident on the housing 26, the temperature of the housing 26 rises. Far-infrared radiation is generated from the inner surface of the housing 26 as the temperature rises, and far-infrared rays from the housing 26 are incident on the plastic substrate 12.

Usually, the plastic material which is the material of the plastic substrate 12 has absorption characteristics that absorbs little near-infrared rays and absorb far-infrared rays much more. In other words, the plastic material has absorption characteristics that the integral value in the wavelength range of 1.2 μm to 5.0 μm in the absorption spectrum of the plastic material is smaller than the integral value in the wavelength range 5.0 μm to 10 μm.

Therefore, when the far-infrared radiation from the housing 26 occurs, the far-infrared rays are absorbed by the plastic substrate 12, so that the temperature of the plastic substrate 12 rises unnecessarily. When the temperature of the plastic substrate 12 rises, for example, becomes a glass transition temperature or more, the plastic substrate 12 is deformed, and thus it is impossible to perform a subsequent step, or a defective product ratio of the manufactured organic EL device is increased. As a result, the manufacturing yield decreases.

From the viewpoint of suppressing the temperature rise of the plastic substrate 12 caused by the far-infrared rays, it is conceivable to blow cooling gas onto the plastic substrate 12. If air is used as the cooling gas, the functional layer FL tends to deteriorate when the functional layer FL is formed, and thus it is conceivable that the inert gas G is used to prevent the deterioration of the functional layer FL. However, if the inert gas G is used, the manufacturing cost of the organic EL device increases.

Furthermore, as the method for cooling the plastic substrate 12, it is also conceivable to cool a conveying roller R in contact with the plastic substrate 12 or to use a metallic belt conveyor with high thermal conductivity for conveying the plastic substrate 12. However, the plastic substrate 12 is not cooled between the conveying roller R and the conveying roller R or at the joint of the belt conveyor. Therefore, the heating state of the coating film 22 becomes non-uniform through the plastic substrate 12. As a result, the cured state of the coating film 22 tends to be non-uniform. Therefore, the subsequent step cannot be performed, or the defective product ratio of the manufactured organic EL device is increased, and the manufacturing yield of the organic EL device is lowered.

On the other hand, in the method for manufacturing the organic EL device 10, in the heating step, a part of the housing 26 which is the member of the infrared heating furnace 24, that is, the top wall 32, the bottom wall 34, and the side walls 36 and 38, are cooled to 100° C. or less. The top wall 32, the bottom wall 34, and the side walls 36 and 38 surround the periphery of the plastic substrate 12 in a tunnel shape. Therefore, when the coating film 22 is heated by the infrared irradiation, the cooling region cooled to 100° C. or less in a tunnel shape is formed at a position distant from the plastic substrate 12 around the plastic substrate 12.

When the member which absorbs the infrared rays IR is cooled to 100° C. or less, the far-infrared radiation tends not to occur rapidly. Therefore, as described above, when the top wall 32, the bottom wall 34, and the side walls 36 and 38 are cooled to form the cooling region, the far-infrared radiation from the top wall 32, the bottom wall 34, and the side walls 36 and 38 hardly occurs. Therefore, the incidence of the far-infrared rays from the housing 26 (furnace wall of the infrared heating furnace 24) to the plastic substrate 12 is suppressed. For example, the amount of the far-infrared rays incident on the plastic substrate 12 can be reduced to ⅓ or less of the amount of the near-infrared rays incident on the plastic substrate 12 by adjusting the temperature, the flow rate, and the like of the cooling water W. Therefore, the temperature rise of the plastic substrate 12 is suppressed, and the damage such as deformation of the plastic substrate 12 is prevented. Therefore, the manufacturing yield of the organic EL device 10 can be improved.

In the heating step, in a mode in which the inert gas G is blown onto at least one of the plastic substrate 12 and the coating film 22, since the plastic substrate 12 is also cooled by the inert gas G, the temperature rise of the plastic substrate 12 is more suppressed. As described above, even when the inert gas G is used to cool the plastic substrate 12, if the top wall 32, the bottom wall 34, and the side walls 36 and 38 are cooled to 100° C. or less, the amount of the inert gas G can be reduced as compared with a case in which the top wall 32 or the like is not cooled to 100° C. or less. Therefore, the manufacturing cost of the organic EL device 10 can be reduced.

Furthermore, the top wall 32, the bottom wall 34, and the side walls 36 and 38 cooled by the cooling mechanism 30 are arranged apart from the plastic substrate 12. Therefore, as in the case of cooling the conveying roller R in contact with the plastic substrate 12 or in the case of using the metallic belt conveyor, non-uniformity in the heating state of the coating film 22 does not occur and the coating film 22 is uniformly cured. From this viewpoint as well, the manufacturing yield of the organic EL device 10 can be improved.

In a mode in which the absorption rate of the far-infrared rays of the top wall 32, the bottom wall 34, and the side walls 36 and 38 cooled to 100° C. or less is 80% or more, the far-infrared rays inside the housing 26 are absorbed thereby. Therefore, the amount of the far-infrared rays inside the housing 26 can be significantly reduced. As a result, the temperature rise of the plastic substrate 12 can be further suppressed. The case in which the far-infrared absorption rate of the top wall 32, the bottom wall 34, and the side walls 36 and 38 is 80% or more is a meaning including the case in which the far-infrared absorption rate of the top wall 32, the bottom wall 34, and the side walls 36 and 38 is 80% or more by coating the inner surfaces of the top wall 32, the bottom wall 34, and the side walls 36 and 38 with an absorbent that absorbs far-infrared rays.

In a mode in which the organic EL device 10 is manufactured by using the band-shaped plastic substrate 12 having flexibility and having a longitudinal length of 10 times or more the length in the width direction as illustrated, the roll-to-roll method can be employed as described above. In this case, while the plastic substrate 12 is conveyed, the steps included in the manufacturing method of the organic EL device 10 can be continuously performed, so that the productivity of the organic EL device 10 is improved.

Next, verification experiments on the operation and effect of cooling a part of the members of the infrared heating furnace 24 to 100° C. or less will be described.

Figure 5:
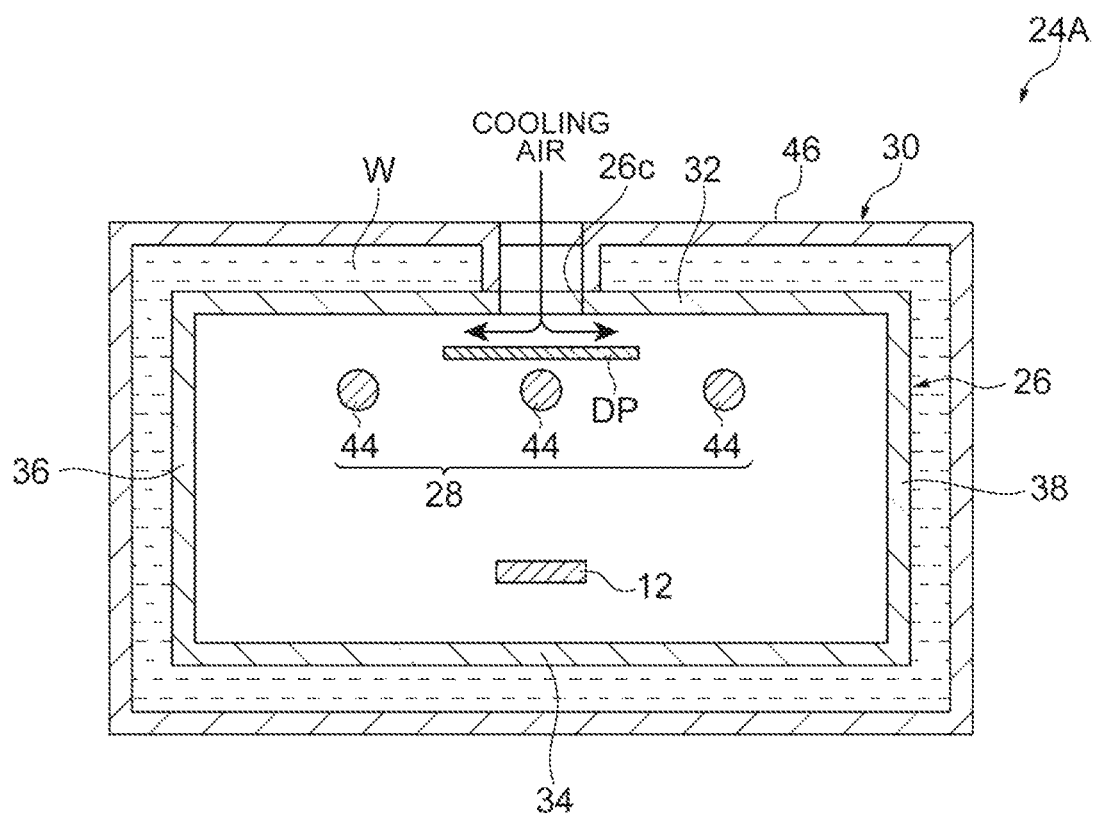
FIG. 5 is a schematic diagram for describing a schematic configuration of an infrared heating furnace used in Examples 1 and 2.

In this verification, a substrate having a size of 24 mm×24 mm×0.7 mm was used as the plastic substrate 12. The material of the plastic substrate 12 was PEN, and the glass transition temperature thereof was 155° C. The plastic substrate 12 was heated by the infrared heating furnace 24A illustrated in FIG. 5. The infrared heating furnace 24A was provided with a box-shaped housing 26, three infrared lamps 44, and a cooling mechanism 30.

The material of the housing 26 was SUS. A cooling air inlet port 26c was formed in the housing 26, and a cooling air diffuser plate DP was disposed so as to face the cooling air inlet port 26c at a position separate from the cooling air inlet port 26c. The cooling air diffuser plate DP was disposed between the cooling air inlet port 26c and the infrared lamp 44. The material of the cooling air diffuser plate DP was SUS.

The three infrared lamps 44 were arranged to face the plastic substrate 12 in the housing 26. The distance between the infrared lamp 44 and the plastic substrate 12 was 150 mm. The distance between the infrared lamp 44 and the plastic substrate 12 is the distance between the plane including the centers of the three infrared lamps 44 and the plastic substrate 12. From the infrared lamp 44, infrared rays IR including a wavelength range of 1.2 µm to 10.0 µm were emitted.

As in the case of the infrared heating furnace 24, a cooling jacket 46 was employed as the cooling mechanism 30. The cooling jacket 46 was configured such that cooling water W flows into the cooling jacket 46, and the cooling jacket 46 covered all regions of the outer surface of the housing 26 except for the cooling air inlet port.

Example 1

In Example 1, by supplying power of 500 W to the infrared lamp 44, the plastic substrate 12 was irradiated with infrared rays IR from the infrared lamp 44 for 10 minutes to heat the plastic substrate 12. During this heating, the cooling water W of 17° C. was flowed into the cooling jacket 46. Furthermore, air was supplied as cooling air from the cooling air inlet port 26c into the housing 26 at a flow rate of 50 L/min.

The wall surface temperature of the housing 26, the temperature of the infrared lamp 44 (lamp temperature), and the temperature of the plastic substrate 12 (substrate temperature) were actually measured after 10 minutes from the start of the irradiation of the infrared rays IR on the plastic substrate 12, and were 52° C., 200° C., and 153° C. as shown in Table 1, respectively. Based on these conditions, the incident amount of the near-infrared rays and the incident amount of the far-infrared rays on the plastic substrate 12 were calculated by simulation using a Monte Carlo method. As a result, as shown in Table 1, the incident amount of the near-infrared rays was 7.8 kw/m² and the incident amount of the near-infrared rays was 2.4 kw/m².

TABLE 1

|  | Wall surface temperature | Substrate temperature | Lamp temperature | Incident amount of near-infrared rays | Incident amount of far-infrared rays |
|---|---|---|---|---|---|
| Example 1 | 52° C. | 153° C. | 200° C. | 7.8 kw/m² | 2.4 kw/m² |
| Example 2 | 54° C. | 153° C. | 200° C. | 7.8 kw/m² | 2.4 kw/m² |

Example 2

In Example 2, the heating experiment of the plastic substrate 12 was performed under the same conditions as in Example 1, except that the cooling air was not supplied from the cooling air inlet port 26c to the housing 26. The wall surface temperature of the housing 26, the temperature of the infrared lamp 44 (lamp temperature), and the temperature of the plastic substrate 12 (substrate temperature) were actually measured and were 54° C., 200° C., and 153° C. as shown in Table 1 above, respectively. Based on these conditions, the incident amount of the near-infrared rays and the incident amount of the far-infrared rays on the plastic substrate 12 were calculated by simulation using a Monte Carlo method, as in the case of Example 1. As a result, as shown in Table 1, the incident amount of the near-infrared rays was 7.8 kw/m² and the incident amount of the near-infrared rays was 2.4 kw/m².

From the results of Examples 1 and 2, it is understood that the wall surface temperature can be cooled to 100° C. or less by cooling the housing 26 with the cooling jacket. In this way, when the wall surface temperature was 100° C. or less, the temperature of the plastic substrate 12 could be suppressed to about 153° C., which was not higher than the glass transition temperature of PEN that was the material of the plastic substrate 12. It has been also found that the incident amount of the far-infrared rays on the plastic substrate 12 could be reduced to ⅓ or less of the incident amount of the near-infrared rays.

Next, a modification of the infrared heating furnace used for forming the functional layer FL will be described.

MODIFICATION 1

In the mode illustrated in FIG. 4, the top wall 32, the bottom wall 34, and the side walls 36 and 38 of the housing 26 are covered with the cooling jacket 46 of the cooling mechanism 30, and the cooling region is formed in the tunnel shape around the conveying path of the plastic substrate 12. However, for example, as in the infrared heating furnace 24B illustrated in FIG. 6, the cooling jacket 46 constituting the cooling mechanism 30 is provided on the top wall 32 and the bottom wall 34 positioned on the upper side and the lower side of the plastic substrate 12 in the thickness direction, and the top wall 32 and the bottom wall 34 may be cooled to 100° C. or less. The front surface (the upper surface in FIG. 6) and the rear surface (the lower surface in FIG. 6) of the plastic substrate 12 used for the organic EL device are usually larger in area than the side surface of the plastic substrate 12. Therefore, if at least the top wall 32 and the bottom wall 34 are cooled to 100° C. or less and the far-infrared radiation from them is suppressed, the incidence of the far-infrared rays on the plastic substrate 12 is easily reduced.

Figure 6:
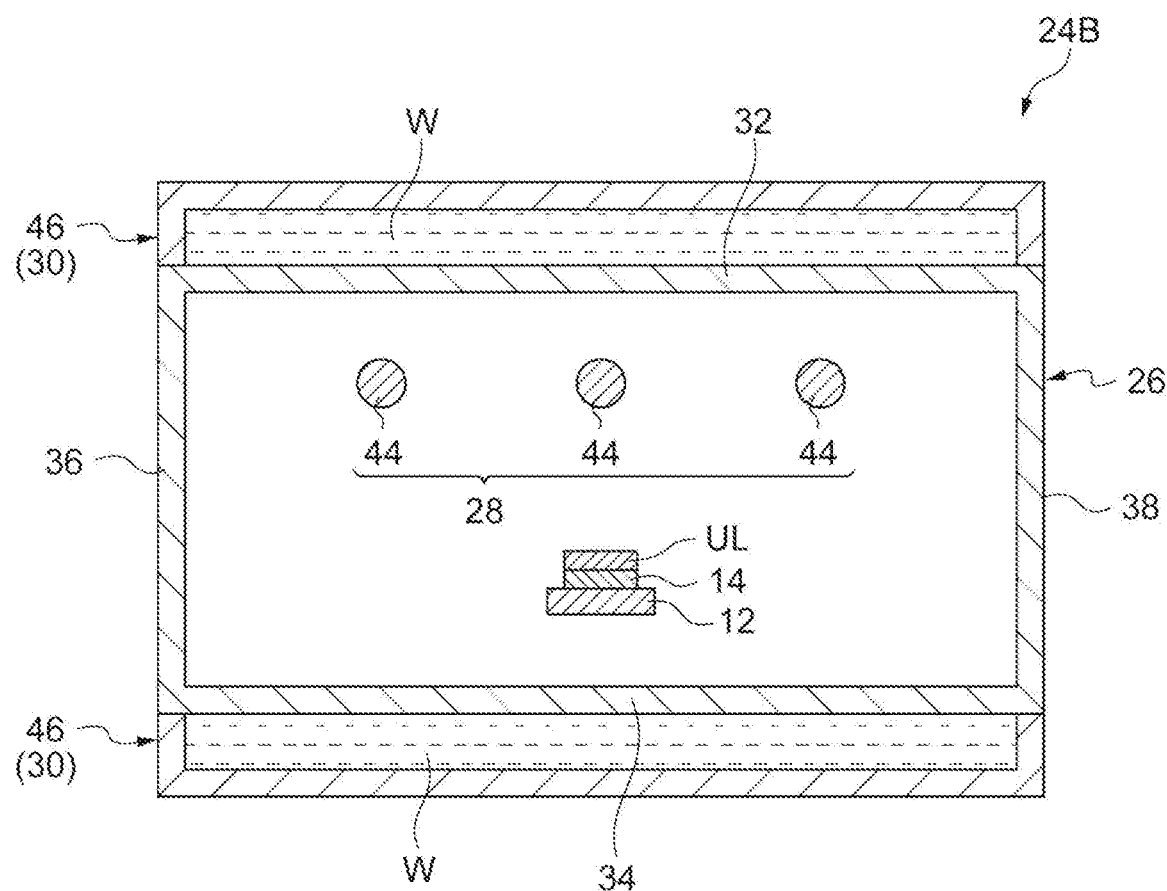
FIG. 6 is a schematic diagram for describing a schematic configuration of a modification of an infrared heating furnace.

In FIG. 6, the case in which the top wall 32 and the bottom wall 34 are cooled by the cooling mechanism 30 is exemplified as the modification, but it is enough that a part of the housing 26 is cooled to 100° C. or less by the cooling mechanism 30.

MODIFICATION 2

Figure 7:
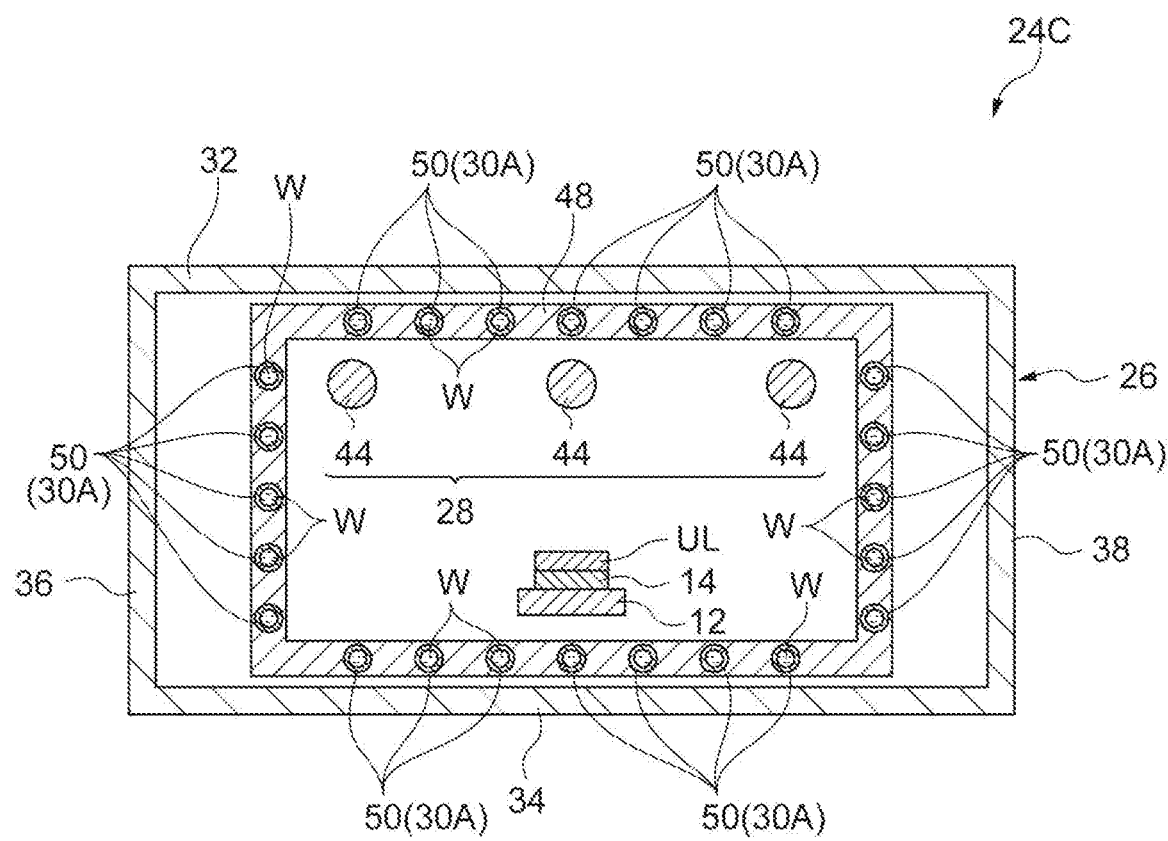
FIG. 7 is a schematic diagram for describing a schematic configuration of another modification of an infrared heating furnace.

As in the infrared heating furnace 24C illustrated in FIG. 7, the cooling region may be formed by providing the cooling member 48 between the housing 26 and the plastic substrate 12 and cooling the cooling member 48 with the cooling mechanism 30A. As an example of the cooling member 48, a tunnel-shaped (or tubular) cooling member 48 formed so as to surround the plastic substrate 12 is illustrated in FIG. 7.

In Modification 2, the cooling member 48 extends in the conveying direction of the plastic substrate 12. As illustrated in FIG. 7, the shape of the cross-section of the cooling member 48 orthogonal to the conveying direction of the plastic substrate 12 may be a quadrangular shape (a square shape, a rectangular shape, or the like), or may be a circular shape. The material of the cooling member 48 is SUS, iron, ceramics, or the like. As illustrated in FIG. 7, the cooling mechanism 30A can have a pipe 50 which is provided in the cooling member 48 and allows the cooling water W to flow. The pipe 50 may be attached to the outer surface or the inner surface of the cooling member 48.

In Modification 2, when the coating film 22 is heated with the infrared rays IR, the cooling member 48 is cooled to 100° C. or less by the cooling mechanism 30A. The cooling member 48 surrounds the plastic substrate 12, and the infrared irradiation section 28 is also arranged inside the cooling member 48. Therefore, most of the infrared rays IR irradiated from the infrared irradiation section 28 and directed toward the inner surface of the housing 26 is shielded by the cooling member 48. Therefore, it is difficult for the far-infrared radiation from the inner surface of the housing 26 due to the infrared rays IR to be incident on the plastic substrate 12. Since the cooling member 48 is also cooled to 100° C. or less, the far-infrared radiation from the cooling member 48 also does not occur. Therefore, while the damage to the plastic substrate 12 in the heating step is suppressed, the coating film 22 can be heated with the infrared rays IR.

In the mode in which the infrared heating furnace has the cooling member 48 as in Modification 2, a part of the housing 26 may be further cooled to 100° C. or less by the cooling mechanism.

MODIFICATION 3

Figure 8:
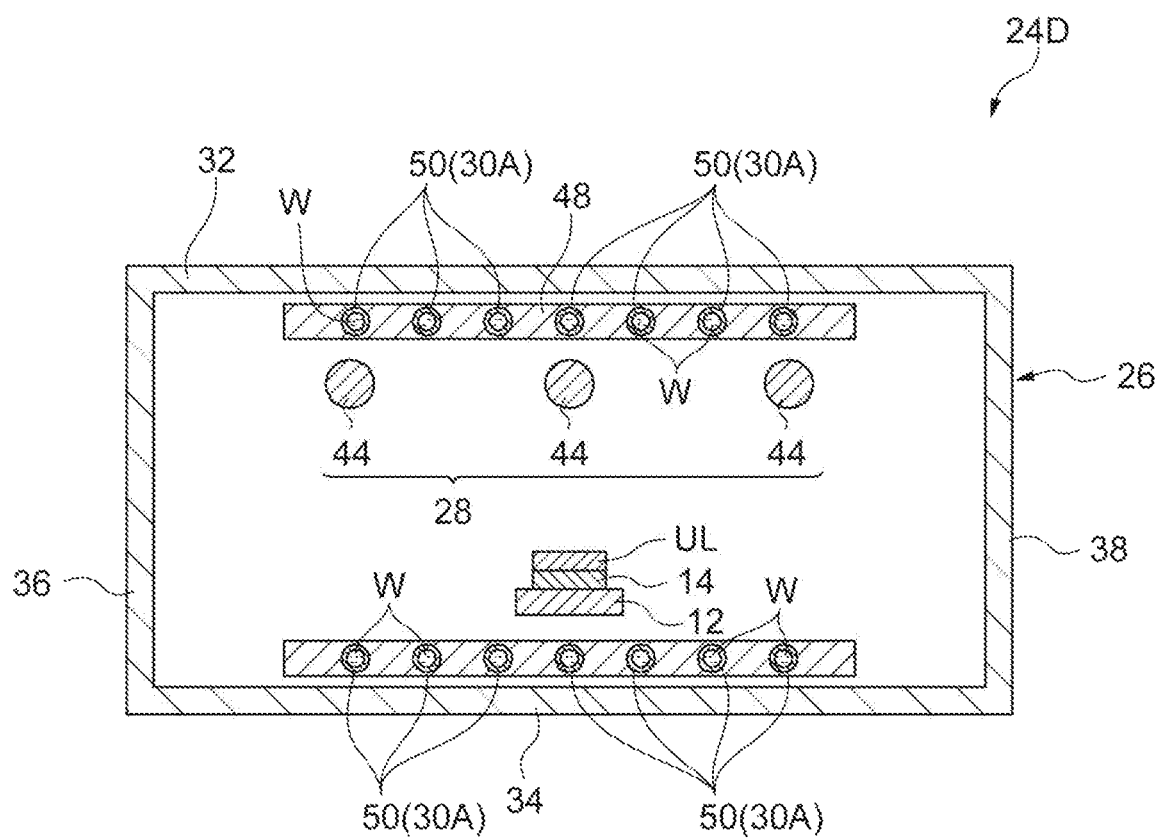
FIG. 8 is a schematic diagram for describing a schematic configuration of further another modification of an infrared heating furnace.

In Modification 2, the tunnel-shaped cooling member 48 is exemplified, but as in the infrared heating furnace 24D illustrated in FIG. 8, a plate-shaped cooling member 48 may be disposed at a position apart from the plastic substrate 12 in a part of the periphery of the plastic substrate 12, and the cooling member 48 may be cooled by the cooling mechanism 30A. In Modification 3, as in Modification 2, the cooling member 48 extends in the conveying direction of the plastic substrate 12. An example of the cooling mechanism 30A is the same as Modification 2. It is enough that the plate-shaped cooling member 48 is provided on a part of the periphery of the plastic substrate 12, but providing the cooling members 48 at least above and below the plastic substrate 12, as illustrated in FIG. 8, and cooling them to 100° C. or less allows the temperature rise of the plastic substrate 12, which is due to the far-infrared rays, to be easily suppressed.

In the case of Modification 3, as in the case of Modification 2, a part of the housing 26 may be further cooled to 100° C. or less by the cooling mechanism.

In the case of providing the cooling member 48 as in Modifications 2 and 3, the cooling member 48 may be made of a material having an average absorption rate of far infrared rays of 80% or more, or an absorbent that absorbs far-infrared rays may be coated on at least the surface of the cooling member 48 on the plastic substrate 12 side such that the average absorption rate of far-infrared rays of the cooling member 48 is 80% or more. Therefore, the far-infrared rays inside the housing 26 can be absorbed by the cooling member 48, and the far-infrared radiation from the cooling member 48 can be prevented by cooling the cooling member 48 to 100° C. or less. As a result, the incidence of the far-infrared rays on the plastic substrate 12 can be further reduced.

Although various embodiments of the present invention have been described above, the present invention is not limited to the illustrated various embodiments. It is intended that the present invention is indicated by the claims and includes all modifications within the scope and meaning of the equivalents to the claims.

As exemplified, in the mode in which the heating step is performed while the plastic substrate is conveyed in the longitudinal direction thereof by using the band-shaped plastic substrate, it is enough that the cooling region formed by cooling the member (for example, a part of the housing, the cooling member, or the like) included in the infrared heating furnace to 100° C. or less is formed in part in the conveying direction of the plastic substrate. A plurality of cooling regions may be discretely formed in the conveying direction. For example, even if the plurality of cooling regions is discretely formed in the conveying direction of the plastic substrate, since the joint between the adjacent cooling regions is separate from the plastic substrate 12, a difference in the heating temperature of the coating film 22 hardly occurs.

Water is exemplified as the refrigerant used by the cooling mechanism. However, the refrigerant is not limited to water, and for example, cooled air, antifreeze, or the like may be used. The cooling mechanism does not need to use the refrigerant, and for example, a Peltier device or the like may be used.

As described above, the organic EL section may be a laminate including other functional layers except for the light emitting layer. An example of the layer configuration of the organic EL device including various functional layers will be described below. The configuration of the organic EL device illustrated in FIG. 1 corresponds to the following configuration (g).

(a) anode/light emitting layer/cathode (b) anode/hole injection layer/light emitting layer/cathode (c) anode/hole injection layer/light emitting layer/electron injection layer/cathode (d) anode/hole injection layer/light emitting layer/electron transport layer/electron injection layer/cathode (e) anode/hole injection layer/hole transport layer/light emitting layer/cathode (f) anode/hole injection layer/hole transport layer/light emitting layer/electron injection layer/cathode (g) anode/hole injection layer/hole transport layer/light emitting layer/electron transport layer/electron injection layer/cathode (h) anode/light emitting layer/electron injection layer/cathode (i) anode/light emitting layer/electron transport layer/electron injection layer/cathode The symbol "/" means that the layers on both sides of the symbol "/" are bonded together.

In the case in which at least one of the hole injection layer and the hole transport layer has a function of blocking the transport of electrons, these layers may be referred to as an electron blocking layer. In the case in which at least one of the electron injection layer and the electron transport layer has a function of blocking the transport of holes, these layers may be referred to as a hole blocking layer.

The organic EL device may have a single light emitting layer or two or more light emitting layers. In any one of the layer configurations (a) to (i) above, if the laminated structure disposed between the anode and the cathode is "structural unit I", examples of the configuration of the organic EL device having two light emitting layers include a layer configuration illustrated in (j) below. The layer configurations of the two (structural unit I) may be the same as or different from each other.

(j) anode/(structural unit I)/charge generation layer/(structural unit I)/cathode Here, the charge generation layer is a layer which generates holes and electrons by applying an electric field.

Examples of the charge generation layer can include a thin film made of vanadium oxide, ITO, molybdenum oxide, or the like.

When "(structural unit I)/charge generation layer" is "structural unit II", examples of the configuration of the organic EL device having three or more light emitting layers can include a layer constitution shown in (k) below.

(k) anode/(structural unit II) x/(structural unit I)/cathode

The symbol "x" represents an integer of 2 or more, and "(structural unit II) x" represents a laminate in which (structural unit II) is laminated in x stages. In addition, the layer configurations of a plurality of (structural unit II) may be the same as or different from each other. The organic EL device may be formed by directly laminating a plurality of light emitting layers without providing the charge generation layer.

The electrode formed on the plastic substrate 12 is described as the anode, but the cathode may be provided on the plastic substrate side.

The method for manufacturing the organic electronic device having the organic functional layer can be applied to a method for manufacturing, in addition to the exemplified organic EL device, an organic electronic device having predetermined functional layers such as an organic transistor (organic electronic device), an organic photoelectric conversion device (organic electronic device), and an organic solar cell (organic electronic device).

REFERENCE SIGNS LIST

10 organic EL device (organic electronic device)
22 coating film
24, 24A, 24B, 24C, 24D infrared heating furnace
26 housing (member of infrared heating furnace)
28 infrared irradiation section
30 cooling mechanism
30, 30A cooling mechanism
32 top wall (furnace wall)
34 bottom wall (furnace wall)
36, 38, 40, 42 side wall (furnace wall)
48 cooling member
FL functional layer
L coating liquid

The invention claimed is:

1. A method for manufacturing an organic electronic device, comprising:
    a coating film formation step of applying a coating liquid for a functional layer having a predetermined function onto a plastic substrate to form a coating film; and
    a heating step of heating and curing the coating film by irradiating the coating film with infrared rays in an infrared heating furnace to form the functional layer,
    wherein in the heating step, the coating film is heated and cured by the infrared rays while a member of the infrared heating furnace is cooled to 100° C. or less, the member being disposed around the plastic substrate so as to be separate from the plastic substrate, and
    wherein the member of the infrared heating furnace is cooled by cooling water.

2. The method for manufacturing the organic electronic device according to claim 1,
    wherein the coating liquid contains a material having a crosslinkable group, and
    in the heating step, the coating film is heated and cured by crosslinking the crosslinkable group by the infrared rays.

3. The method for manufacturing the organic electronic device according to claim 1,
    wherein in the heating step, the coating film is heated and cured by the infrared rays while a part of a furnace wall, which is a member of the infrared heating furnace, is cooled to 100° C. or less.

4. The method for manufacturing the organic electronic device according to claim 3,
    wherein the coating film is heated and cured with the infrared rays while upper and lower regions of the furnace wall in a thickness direction of the plastic substrate are cooled to 100° C. or less.

5. The method for manufacturing the organic electronic device according to claim 3,
    wherein in the heating step, the coating film is irradiated with the infrared rays while the plastic substrate is conveyed in the infrared heating furnace, and
    the coating film is heated and cured with the infrared rays while a region of the furnace wall surrounding a conveying path of the plastic substrate in a tunnel shape is cooled to 100° C. or less.

6. The method for manufacturing the organic electronic device according to claim 3,
    wherein the infrared heating furnace has at least one cooling member between a furnace wall of the infrared heating furnace and the plastic substrate, and
    the coating film is heated and cured with the infrared rays while the cooling member is cooled to 100° C. or less together with a part of a furnace wall of the infrared heating furnace.

7. The method for manufacturing the organic electronic device according to claim 1,
    wherein the infrared heating furnace has a cooling member disposed between a furnace wall of the infrared heating furnace and the plastic substrate, and
    the coating film is heated and cured with the infrared rays while the cooling member is cooled to 100° C. or less.

8. The method for manufacturing the organic electronic device according to claim 7,
    wherein the infrared heating furnace has the cooling member disposed on each of upper and lower sides in the thickness direction of the plastic substrate.

9. The method for manufacturing the organic electronic device according to claim 7,
    wherein in the heating step, the coating film is irradiated with the infrared rays while the plastic substrate is conveyed in the infrared heating furnace, and
    the cooling member is formed in a tunnel shape so as to surround a conveying path of the plastic substrate.

10. The method for manufacturing the organic electronic device according to claim 1,
    wherein, among the infrared rays incident on the plastic substrate, an amount of infrared rays having a wavelength range of 5.0 μm to 10.0 μm is ⅓ or less of an amount of infrared rays having a wavelength range of 1.2 μm to 5.0 μm.

11. The method for manufacturing the organic electronic device according to claim 1,
    wherein, in the member cooled to 100° C. or less, an average absorption rate of infrared rays having a wavelength range of 5.0 μm to 10.0 μm is 80% or more.

12. The method for manufacturing the organic electronic device according to claim 1,
    wherein in the heating step, inert gas is blown onto either the plastic substrate or the coating film.

13. The method for manufacturing the organic electronic device according to claim 1, wherein the plastic substrate has a band shape and is flexible, and a length of the plastic substrate in a longitudinal direction is 10 times or more of a length in a short side direction.

14. The method for manufacturing the organic electronic device according to claim 1, wherein the functional layer is a hole injection layer, a hole transport layer, a light emitting layer, an electron transport layer, or an electron injection layer.

15. The method for manufacturing the organic electronic device according to claim 1, wherein the member of the infrared heating furnace suppresses the far-infrared radiation from a furnace wall of the infrared heating furnace.

16. A method for producing a functional layer, comprising:

a coating film formation step of applying a coating liquid for a functional layer having a predetermined function onto a plastic substrate to form a coating film; and a heating step of heating and curing the coating film by irradiating the coating film with infrared rays in an infrared heating furnace to form the functional layer, wherein in the heating step, the coating film is heated and cured by the infrared rays while a member of the infrared heating furnace is cooled to 100° C. or less, the member being disposed around the plastic substrate so as to be separate from the plastic substrate, and wherein the member of the infrared heating furnace is cooled by cooling water.

* * * * *